United States Patent
Seyedmohammadi et al.

(10) Patent No.: US 10,038,109 B2
(45) Date of Patent: Jul. 31, 2018

(54) SILVER SOLAR CELL CONTACTS

(75) Inventors: Shahram Seyedmohammadi, San Diego, CA (US); Himal Khatri, Vista, CA (US); Srinivasan Sridharan, Strongsville, OH (US); Aziz S. Shaikh, San Diego, CA (US)

(73) Assignee: Heraeus Precious Metals North America Conshohocken LLC, West Conshohocken, PA (US)

( * ) Notice: Subject to any disclaimer, the term of this patent is extended or adjusted under 35 U.S.C. 154(b) by 376 days.

(21) Appl. No.: 14/343,247

(22) PCT Filed: Sep. 5, 2012

(86) PCT No.: PCT/US2012/053748
§ 371 (c)(1),
(2), (4) Date: Oct. 7, 2014

(87) PCT Pub. No.: WO2013/036510
PCT Pub. Date: Mar. 14, 2013

(65) Prior Publication Data
US 2015/0027524 A1     Jan. 29, 2015

Related U.S. Application Data

(60) Provisional application No. 61/532,662, filed on Sep. 9, 2011.

(51) Int. Cl.
*H01L 31/0224* (2006.01)
*H01L 31/0216* (2014.01)
(Continued)

(52) U.S. Cl.
CPC ....... *H01L 31/022425* (2013.01); *H01B 1/16* (2013.01); *H01L 31/028* (2013.01);
(Continued)

(58) Field of Classification Search
CPC .................... H01L 31/022425–31/022458
See application file for complete search history.

(56) References Cited

U.S. PATENT DOCUMENTS 5,928,568 A * 7/1999 Paszkiet .................. C23C 24/08
174/257
2003/0008135 A1* 1/2003 Kawamura ......... G02F 1/13439
428/336

(Continued)

FOREIGN PATENT DOCUMENTS

EP     1775776     4/2007
EP     2472526     7/2012
(Continued)

OTHER PUBLICATIONS

International Search Report issued in PCT/US2012/053748 dated Nov. 1, 2012.

*Primary Examiner* — Eric R Smith
(74) *Attorney, Agent, or Firm* — Blank Rome LLP; Charles R. Wolfe, Jr.; Cole T. Duncan

(57) ABSTRACT

Solar cell conductor formulations made are from two silver powders having different particle size distributions, an aluminum powder, and two frit glass compositions having softening points in the range of 250-700° C. and whose softening points differ by at least 10° C.

12 Claims, 3 Drawing Sheets

(51) Int. Cl.
*H01L 31/028* (2006.01)
*H01B 1/16* (2006.01)

(52) U.S. Cl.
CPC .. *H01L 31/02167* (2013.01); *H01L 31/02245* (2013.01); *H01L 31/022458* (2013.01); *Y02E 10/50* (2013.01)

(56) References Cited

U.S. PATENT DOCUMENTS

| | | | |
|---|---|---|---|
| 2006/0231800 A1* | 10/2006 | Wang | C03C 3/064 252/500 |
| 2007/0138659 A1 | 6/2007 | Konno | |
| 2007/0235075 A1* | 10/2007 | Park | H01L 31/035281 136/252 |
| 2009/0056798 A1* | 3/2009 | Merchant | H01B 1/16 136/256 |
| 2010/0126565 A1 | 5/2010 | Takeda et al. | |
| 2010/0180934 A1 | 7/2010 | Naito et al. | |
| 2010/0269893 A1* | 10/2010 | Prince | B23K 1/0016 136/252 |
| 2011/0000531 A1* | 1/2011 | Kwag | H01B 1/16 136/255 |
| 2011/0005582 A1 | 1/2011 | Szlufcik et al. | |
| 2011/0086466 A1 | 4/2011 | Hacke et al. | |
| 2011/0114170 A1* | 5/2011 | Lee | H01B 1/22 136/256 |
| 2011/0120535 A1 | 5/2011 | Prince et al. | |
| 2011/0192456 A1* | 8/2011 | Hang | C03C 8/02 136/256 |
| 2011/0308596 A1* | 12/2011 | Carroll | B22F 1/0059 136/256 |
| 2011/0315217 A1* | 12/2011 | Gee | H01B 1/20 136/256 |
| 2012/0119153 A1* | 5/2012 | Choi | H01B 1/22 252/500 |
| 2012/0255605 A1* | 10/2012 | Takeda | H01B 1/22 136/256 |

FOREIGN PATENT DOCUMENTS

| | | | |
|---|---|---|---|
| WO | WO-1992022929 A1 | 12/1992 | |
| WO | WO 2012031078 A1 * | 3/2012 | ............... H01B 1/22 |
| WO | WO/2012/111478 | 8/2012 | |

* cited by examiner

SILVER SOLAR CELL CONTACTS

BACKGROUND OF THE INVENTION

1. Field of Invention

This invention relates to solar cell conductor formulations made from two silver powders having different particle size distributions, an aluminum powder, and two frit glass compositions having softening points in the range of 250-700° C. and whose softening points differ by at least 10° C. The formulations are pastes dispersed in an organic system. The formulations can fire-through a passivation layer(s), thereby allowing the use of a passivation layer on both sides of a silicon wafer based photovoltaic cell. The formulations are screen-printable and suitable for use in the fabrication of photovoltaic devices, in particular a solar cell with n-type emitter or a metal wrap through (MWT) and emitter wrap through (EWT).

2. Description of Related Art

Solar cells are generally made of semiconductor materials, such as silicon (Si), which convert sunlight into useful electrical energy. A conventional solar cell is in general made of thin p-type Si wafer in which the required PN junction is formed by diffusing phosphorus (P) from a suitable phosphorus source on top of wafer generating the n-type emitter layer. The side of the silicon wafer on which sunlight is incident is generally coated with an anti-reflective coating (ARC) to prevent reflective loss of sunlight. This ARC also passivates the surface which decreases electronic/optical loss due to surface recombination. Low resistance contacts to n-type emitter layers are known. However, a need exists to make low contact resistance contacts to p-type emitters. The inventive pastes are directed towards this need.

BRIEF SUMMARY OF THE INVENTION

The new and developing generation of Si solar cells is made of a n-type Si wafer. The device PN junction is formed by diffusing Boron (B) from a suitable boron source on top of a wafer to produce a p-type emitter layer. A two dimensional electrode grid pattern known as a front contact makes a connection to the p-type emitter of silicon. Contacts known as silver rear contacts, which take the shape of a two dimensional electrode grid pattern, are made out of silver paste are printed and fired on the n-side of silicon. These contacts are the electrical outlets from the PN junction to the outside load. Such a cell can be utilized either as a bifacial solar cell with the capability of capturing illumination on both sides, or just on one (front) side when an opaque background is provided.

DETAILED DESCRIPTION OF THE INVENTION

Figure 4:
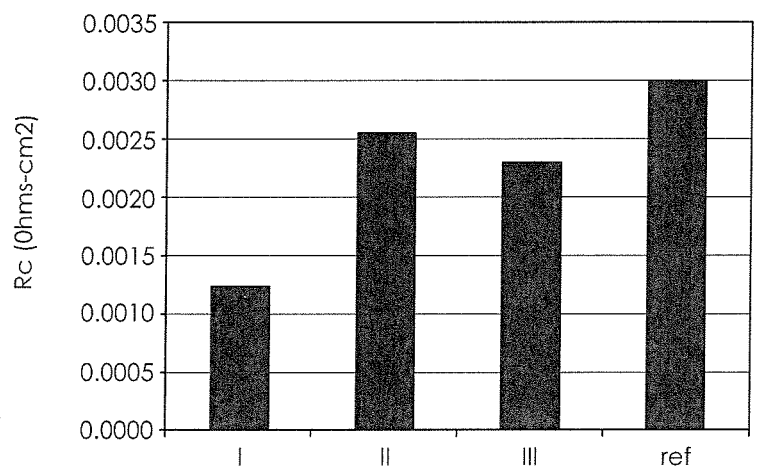
FIG. 4 graphically depicts contact resistance of Ag/Al fire-through pastes for p-type emitter in silicon solar cells.
Figure 5:
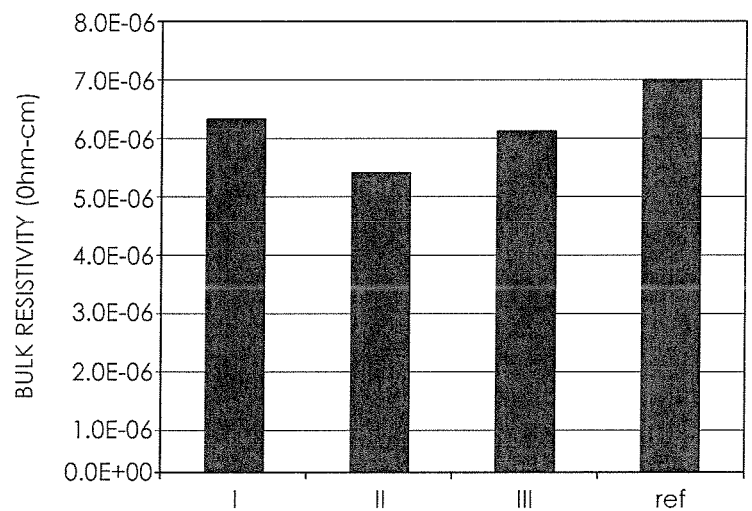
FIG. 5 graphically depicts bulk resistivity of Ag/Al fire-through pastes for p-type emitter in silicon solar cells.

The invention relates to a new generation of solar cells using an n-type silicon base material with a p-type emitter. This type of solar cell can exhibit a solar cell efficiency with a potential of 23% and higher. To reach this goal, a large contribution comes from the metal contacts where photo-generated charge carriers are collected. However, it is challenging to ensure that the p-type emitter has low contact resistance by the use of conventional silver pastes. Accordingly, Ag—Al pastes have been developed to provide improved low contact resistance to the p-type emitter having a passivated silicon surface. The inventors have achieved contact resistance of less than 1.5 mOhm-cm$^2$ to p-emitter Silicon as well as 5-6 µOhm-cm bulk resistivity for certain inventive pastes as shown in FIGS. 4 and 5. Both components significantly reduce solar cell series resistance. In addition, these pastes have fire-through behavior meaning that they etch through the SiNx layer to make contact to the p-type emitter. Despite the presence of Al in the formula, the pastes were designed to maintain the high quality of junction voltage indicated by a large Voc and as a figure of merit a low leakage saturation current density in the space-charge region, $J_{02}$ in a two diode I-V model.

Alternate configurations of solar cells include metallization wrap around (MWA), metallization wrap through (MWT), and back junction structures, in addition to emitter wrap through (EWT). MWA and MWT have metal current collection grids on the front surface. These grids are, respectively, wrapped around the edge or through holes to the back surface in order to make a back-contact cell. The unique feature of EWT cells, in comparison to MWT and MWA cells, is that there is no metal coverage on the front side of the cell, which means that none of the incident light is blocked, resulting in higher efficiencies. The EWT cell wraps the current-collection junction ("emitter") from the front surface to the rear surface through doped conductive channels in the silicon wafer. "Emitter" refers to a heavily doped region in a semiconductor device. Such conductive channels can be produced by, for example, drilling holes in the silicon substrate with a laser and subsequently forming the emitter inside the holes at the same time as forming the emitter on front and rear surfaces. Back junction cells have both the negative and positive polarity collection junctions on the rear surface of the solar cell. Because most of the light is absorbed—and therefore also most of the carriers are photogenerated—near the front surface, back junction cells require very high material quality so that carriers have sufficient time to diffuse from the front to the rear surface with the collection junctions on the rear surface. In comparison, the EWT cell maintains a current collection junction on the front surface, which is advantageous for high current collection efficiency. The EWT cell disclosed in U.S. Pat. No. 5,468,652, incorporated herein by reference. Further details on MWA and MWT solar cells can be found in commonly owned copending U.S. patent Ser. No. 12/682,040, herein incorporated by reference.

The inventors have found that having silver powders at two distinct particle size ranges at a defined ratio of one silver powder to the other improves deagglomeration and prevents excessive sintering of silver while maintaining good conductivity. Furthermore as temperature increases beyond the glass transition temperature (Tg) of the glass with lower softening point, this glass frit starts to etch through the passivation layer and wet the Si surface. A portion of Ag (and Al) particles may dissolve in the glass and precipitate at Si interface, initiating metal-semiconductor contact wherein Al decreases the barrier width, Schottky Barrier, which results in improved contact resistance. The proportion and average particle size distribution of aluminum is just enough to prevent any damage to the junction and also avoids creating a shunting issue. When the temperature rises above the Tg of the higher softening point frit, then the higher softening point frit (a) reacts with the aggressive lower softening point glass and prevents its excessive attack into silicon preventing the destruction of PN junction; (b) dissolves silver from the later sintering coarse silver powder leading to continued precipitation of Ag—Si islands. Thus the resultant contact can have overall lower contact resistance and bulk resistivity yet does not shunt the junction.

Accordingly, an embodiment of the invention is a solar cell comprising (a) an n-type silicon wafer, (b) a p-type emitter, (c) a contact comprising a paste, the paste comprising, prior to firing, (i) one or more silver powders, (ii) a first glass frit having a softening temperature in the range of 250-500° C., and a $D_{50}$ particle size range of 0.2 to 20 microns, (iii) a second glass frit having a softening temperature in the range of 250-500° C., and a $D_{50}$ particle size range of 0.2 to 20 microns, such that the first and second softening temperatures differ by at least 10° C.

In one embodiment of the invention, with the glass frits as disclosed elsewhere, the first silver powder has a $D_{50}$ particle size range of 0.2-1.7, more preferably 0.5-1.7 microns and the second silver powder has a $D_{50}$ particle size range of 1.72-10 microns, more preferably 1.75-5 microns.

An embodiment of the invention is a solar cell comprising (a) an n-type silicon wafer, (b) a p-type emitter, (c) a contact comprising a paste, the paste comprising, prior to firing, (i) a first silver powder, having a first average particle size $D^1_{50}$, (ii) a second silver powder, having a second average particle size $D^2_{50}$, such that $D^1_{50}$ differs from $D^2_{50}$ by more than 2.5%, preferably more than 2.8%, wherein $D^2_{50} > D^1_{50}$, (iii) a first glass frit having a softening temperature in the range of 250-650° C. and a $D_{50}$ particle size range of 0.2 to 20 microns, (iv) a second glass frit having a softening temperature in the range of 300-700° C., and a $D_{50}$ particle size range of 0.2 to 20 microns, such that the first and second softening temperatures differ by at least 10° C.

Still another embodiment of the invention is an n-type Si solar cell with p-type emitter comprising an n-type silicon wafer bearing on the p-side a paste comprising, prior to firing, (a) 40-60 wt % of a first silver powder having a $D_{50}$ average particle size of 0.2-1.7 microns, preferably 0.5-1.7 microns, (b) 25-45 wt % of a second silver powder having a $D_{50}$ average particle size of 1.72-10.0 microns, preferably 1.75-5.0 micron (c) 0.01 to 6 wt % of a trivalent element dopant (such as in the form of metallic or alloy or organometallic or silicides or oxides or borides or nitrides) having a $D_{50}$ particle size of 0.2-10 microns, (d) 1-5 wt % of a first glass composition having a softening point of 250-650° C., (e) 1-5 wt % of a second glass composition having a softening point of 300-700° C., and (f) a quantity of an organic vehicle such that, together with the silver and aluminum powders and glass compositions, totals 100 wt %, wherein the softening points of the first and second glasses differ by at least 10° C.

Another embodiment of the invention is a method of making a solar cell contact comprising: (a) applying to the p-side of a silicon wafer a paste comprising (i) 40-60 wt % of a silver powder having a $D_{50}$ average particle size of 0.2-1.8 microns, (ii) 25-45 wt % of a second portion of silver powder having a $D_{50}$ average particle size of 1.82-10 microns, (iii) 0.2-6.0 wt % of an aluminum or boron or indium or gallium powder having a $D_{50}$ average particle size of 0.2-10 microns, preferably 0.5-10 micron (iv) 1-5 wt % of a first glass composition having a softening point of 250-650° C., and (v) 1-5 wt % of a second glass composition having a softening point of 300-700° C., (vi) a quantity of an organic vehicle such that, together with the silver and aluminum powders and glass compositions, totals 100 wt %, wherein the softening points of the first and second glasses differ by at least 10° C., and (b) firing the wafer, silver powders, aluminum or boron or indium or gallium powder, and glass compositions for a time and temperature sufficient to sinter the powders and fuse the glasses.

Another embodiment of the invention is a method of making a solar cell contact comprising: (a) applying to the p-side of a silicon wafer a paste comprising (i) 40-60 wt % of a silver powder having a $D_{50}$ average particle size of 0.2-1.8 microns, (ii) 25-45 wt % of a second portion of silver powder having a $D_{50}$ average particle size of 1.82-10 microns, (iii) 0.2-6.0 wt % of an aluminum or aluminum alloy powder having a $D_{50}$ average particle size of 0.2-10 microns, preferably 0.5-10 micron (iv) 1-5 wt % of a first glass composition having a softening point of 250-650° C., and (v) 1-5 wt % of a second glass composition having a softening point of 300-700° C., (vi) a quantity of an organic vehicle such that, together with the silver and aluminum powders and glass compositions, totals 100 wt %, wherein the softening points of the first and second glasses differ by at least 10° C., and (b) firing the wafer, silver powders, aluminum or aluminum alloy powder, and glass compositions for a time and temperature sufficient to sinter the powders and fuse the glasses.

Accordingly, an embodiment of the invention is a paste formulation comprising (a) a first silver powder having a particle size in microns of 0.2-1.8 microns, preferably 0.5-1.8, more preferably 0.8-1.5; (b) a second silver powder having a $D_{50}$ average particle size in microns of greater than 1.82 to 10, preferably 1.9-9.0, more preferably 2-8, alternately 2-7; (c) a first glass frit having a softening point in ° C. in the range of 250-600, preferably 300-450, most preferably 325-425, (d) a second glass frit having a softening point in ° C. in the range of 300-700, preferably 350-575, most preferably 435-475; (e) about 0.5-6.0 wt %, preferably 1.5-3.5 wt % more preferably 2-3 wt % of an aluminum powder; wherein the first and second silver powders are present in a weight ratio from 1:10 to 10:1, preferably 1:8 to 8:1, more preferably 1:5-5:1, most preferably 1:2-2:1; and wherein the softening points of the glass frits differ by at least 10° C., or successively more preferably differ by at least 20° C., at least 25° C., at least 30° C., at least 40° C., at least 50° C., at least 60° C., at least 70° C. at least 80° C., at least 90° C. and at least 100° C. It is noted that the glass frits may also be characterized by glass transition temperature (Tg) which broadly speaking is about 20° C. to about 100° C. lower than the softening point of a given glass composition.

Broadly speaking, although two silver powders having $D_{50}$ particle sizes differing by at least 2.5% is most preferred, it is possible to design pastes similar to this invention with a single silver powder with $D_{50}$ particle size of 0.2-10 microns, more preferably 0.5-7 microns, most preferably 0.8-3 microns, as long as the two glass powders have softening points that differ by at least 10° C.

Similarly although the most preferred ranges for the smaller and larger silver particles, (sometimes termed "silver I" and "silver II") are respectively 0.5-1.7 micron and 1.75-5 micron, it is possible to design pastes similar to this invention, with alternate ranges for silver I and silver II within the 0.2-10 micron for silver as long as their $D_{50}$ particle sizes differ by at least 2.5%.

Broadly, the pastes of the invention include several components: glass powders, metal powders, other additives, and organic vehicles, each of which is set forth hereinbelow.

Glass Component.

The glass component of a solar cell is a key to determine the cell's properties including resistivity, fill factor and efficiency. Solar contacts are typically fabricated by the application of a conductive paste containing glass to a silicon substrate. The pastes comprise about 0.1 to about 10 wt %, preferably 0.2 to about 7 wt % of a glass component. The glass component comprises, prior to firing, one or more glass powders. In formulating the pastes, the glass frits typically have $D_{50}$ average particle sizes of about 0.2 to about 20 microns, preferably about 0.3 to about 20 microns, more preferably 0.5 to 10 microns, and still more preferably about 0.8-5 microns, most preferably 0.8-3.5 micron, although other particle sizes may be used as known in the art.

The glass frits used herein have a softening point in ° C. in the range of 250-700, preferably 250-650 or 300-700, more preferably 300-450 or 350-575; yet most preferably 325-475° C. When two or more frit compositions are used, they have independent softening points that differ by at least 5° C. to at least 100° C., preferably 10° C. to at least 100° C.

Although in this invention two glass frits are the preferred embodiment, more than two frits, say three fits or four frit combinations can be used. It is also envisioned that a single glass that could phase separate to two glasses having two distinct softening points as taught in this invention can be used. It is also envisioned that a single glass that could partially crystallize with a residual glass having softening point different from the original glass or having two different glass materials—glass-ceramic and residual glass.

Each glass composition comprises oxide frits. The following embodiments are useful herein: (a) a glass comprising $PbO$ and $SiO_2$; (b) a glass comprising $PbO$ and $B_2O_3$; (c) a glass comprising $PbO$, $Al_2O_3$ and $SiO_2$; (d) a glass comprising $PbO$, $B_2O_3$, and $SiO_2$; (e) a glass comprising $PbO$, $ZnO$, and $SiO_2$, (f) a glass comprising $PbO$, $ZnO$ and $B_2O_3$, (g) a glass comprising $PbO$, $V_2O_5$ and $P_2O_5$, (h) a glass comprising $PbO$ and $TeO_2$, (i) a glass comprising $PbO$ and $P_2O_5$. Lead-free glasses are also useful, for example (j) a glass composition comprising $Bi_2O_3$, $B_2O_3$, and $SiO_2$, (k) a glass comprising $Bi_2O_3$ and $B_2O_3$, (l) a glass comprising $Bi_2O_3$ and $SiO_2$, (m) a glass comprising $Bi_2O_3$, $Al_2O_3$, and $SiO_2$, (n) $Bi_2O_3$, $B_2O_3$, $SiO_2$; (o) a glass comprising $Bi_2O_3$, $ZnO$, and $SiO_2$, (p) a glass comprising $Bi_2O_3$, $ZnO$, and $B_2O_3$. Combinations of any glass in this paragraph are also envisioned. In yet other embodiments, the glass composition comprises (q) $ZnO$, $B_2O_3$, and $SiO_2$, (r) $ZnO$, $Al_2O_3$, and $SiO_2$, or (s) $ZnO$ and $B_2O_3$, and combinations thereof. In still yet another embodiment the glass composition comprises (t) an alkali oxide, $TiO_2$, and $SiO_2$, or (u) only an alkali oxide and $SiO_2$. In particular, in various embodiments of the present invention, the glass compositions may be found in Tables 1-6. Looking to the glass tables below, more than one glass composition can be used, and compositions comprising amounts from different columns in the same table or different tables are envisioned, as long as the softening points of two or more glasses used differ by at least 10° C.

In embodiments incorporating leaded glasses, the glass composition comprises oxide frits including $PbO$ and $SiO_2$. Zinc oxide ($ZnO$) may replace a portion of the $PbO$ in the glass component herein. Similarly $B_2O_3$ may completely or partially replace the $SiO_2$ in the glass. In leaded or lead-free embodiments, all or a portion of $SiO_2$ in a glass may be replaced by one or more of $B_2O_3$, $V_2O_5$, $P_2O_5$, $TeO_2$, $GeO_2$, or $TlO_2$. In particular, in various embodiments of the present invention, a glass composition comprises the ingredients of any of Tables 1-6.

TABLE 1

Oxide frit ingredients in mole percent of the glass component.

| | Glass Composition | | | |
|---|---|---|---|---|
| Ingredient | 1-1 | 1-2 | 1-3 | 1-4 |
| PbO | 15-75 | 15-75 | 25-66 | 40-66 |
| $SiO_2$ | 1-50 | 0-40 | 1-35 | 1-15 |
| $Al_2O_3$ | 0-15 | 0-15 | 1-11 | 2-10 |
| $B_2O_3$ | 0-30 | 1-30 | 0-25 | 1-15 |
| ZnO | 0-50 | 0-50 | 10-35 | 2-12 |
| PbO + ZnO | 15-80 | 15-80 | — | — |
| $B_2O_3$ + $SiO_2$ | 1-80 | 1-70 | 1-65 | 11-38 |

Other embodiments may further comprise $Ta_2O_5$—up to 10 mole %, $Sb_2O_5$—up to 10 mole %, $ZrO_2$—up to 10 mole %, $P_2O_5$—up to 8 mole %, $(In_2O_3+Ga_2O_3)$—up to 10 mole %, $(Y_2O_3+Yb_2O_3)$—up to 15 mole %. An entry such as $(Y_2O_3+Yb_2O_3)$ means that $Y_2O_3$ or $Yb_2O_3$ or a combination of the two is present in the specified amount.

TABLE 2

Further embodiments of glass compositions in the glass component in mole percent of the glass component.

| | Glass Composition | | | | | |
|---|---|---|---|---|---|---|
| Ingredient | 2-1 | 2-2 | 2-3 | 2-4 | 2-5 | 2-6 |
| PbO | 58-64 | 25-40 | 40-60 | 26-34 | 58-70 | 58-66 |
| $SiO_2$ | 25-31 | 20-31 | 25-32 | 27-33 | 20-31 | 1-8 |
| ZnO | 0-10 | 5-34 | | 27-33 | | 5-11 |
| $Al_2O_3$ | 2-11 | 4-10 | 3-8 | 5-11 | 1-11 | 0.5-4 |
| $Ta_2O_5$ | | 0-2 | | 0.1-2 | | |
| $ZrO_2$ | | | 0.1-5 | | 0.1-2 | |
| $B_2O_3$ | | | 6-12 | | | 18-28 |

When at least two glass compositions are present, the selection of their makeup and proportions has an effect on the quality of the solar cell contact. For example the use of a (first) glass composition containing a high proportion of ZnO (e.g., up to about 35 mol %) provides minimum penetration into silicon. Such a glass composition is exemplified by various embodiments in Tables 1 and 2. On the other hand the use of a (second) zinc-free glass composition with high proportion of PbO (e.g., up to about 75 mol %) provides more penetration into silicon. Such a glass composition is exemplified by various embodiments in Tables 1 and 2. Regardless of the number of glass compositions used, the total content of PbO in the glass component overall will fall within the range of about 15 to about 75 mol % PbO, and from about 1 to about 50 mol % $SiO_2$. Varying proportions of the first and second glass compositions can be used in forming a solar cell contact to control, the extent of penetration into silicon, and hence the resultant solar cell properties. For example, within the glass component, the first and second glass compositions may be present in a weight ratio of about 1:20 to about 20:1, and preferably about 1:3 to about 3:1. The glass component preferably contains no cadmium or oxides of cadmium. Further, a portion of PbO can be replaced by $Bi_2O_3$ to provide a glass composition used in making a solar cell within the scope of the present invention. For example, about 1 to about 30 mol % of $Bi_2O_3$ can be used.

In embodiments that exclude lead, each glass composition may comprise oxide frits including $Bi_2O_3$ and $SiO_2$. In particular, in various embodiments of the present invention, glass compositions in Tables 3 and 4 can be used. Regardless of the number of glass compositions used, the total content of $Bi_2O_3$ and $SiO_2$ in the glass component may fall within the range of about 5 to about 85 mol % $Bi_2O_3$ and from about 1 to about 70 mol % $SiO_2$. If a second glass composition is used, the proportions of the glass compositions can be varied to control the extent of paste interaction with silicon, and hence the resultant solar cell properties. For example, within the glass component, the first and second glass compositions may be present in a weight ratio of about 1:20 to about 20:1, alternatively about 1:3 to about 3:1. The glass component preferably contains no lead or oxides of lead, and no cadmium or oxides of cadmium.

TABLE 3

Oxide frit ingredients for bismuth glasses in mole percent.

| | Glass Composition | | |
|---|---|---|---|
| Ingredient | 3-1 | 3-2 | 3-3 |
| $Bi_2O_3$ | 5-85 | 15-80 | 50-80 |
| $SiO_2$ | 1-70 | 2-45 | 15-35 |
| ZnO | 0-55 | 0.1-25 | 1-15 |
| $V_2O_5$ | 0-30 | 0.1-25 | 1-15 |

TABLE 4

Oxide frit ingredients for bismuth glasses in mole percent

| | Glass Composition | | |
|---|---|---|---|
| Ingredient | 4-1 | 4-2 | 4-3 |
| $Bi_2O_3$ | 5-65 | 5-55 | 10-40 |
| $SiO_2$ | 15-70 | 20-70 | 30-65 |
| $B_2O_3$ | 0-35 | 0.1-35 | 3-20 |
| Alkali oxides | 0-35 | 0.1-25 | 5-25 |

One or more of the glass components can be both lead free and bismuth free as exemplified by ZnO—$B_2O_3$—$SiO_2$ glasses and alkali-$TiO_2$—$SiO_2$ glasses in Table 5.

TABLE 5

Oxide frit ingredients for contact glasses in mole percent.

| | Glass Composition | | |
|---|---|---|---|
| Ingredient | 5-1 | 5-2 | 5-3 |
| $Al_2O_3$ | | | 0.5-2.5 |
| $B_2O_3$ | 10-25 | | 10-30 |
| $K_2O$ | 0.5-3.0 | 5-15 | 0.2-2.0 |
| $Li_2O$ | | 1-8 | |
| $Na_2O$ | 0.01-0.50 | 16-28 | 5-15 |
| $P_2O_5$ | | 0.2-4 | |
| $SiO_2$ | 70-90 | 30-50 | 16-26 |
| $TiO_2$ | | 15-25 | 1-5 |
| $V_2O_5$ | | 1-6 | |
| ZnO | | | 21-31 |

Table 6. One or more of the glass components can include a phosphate glass such as PbO—$V_2O_5$—$P_2O_5$ as in Table 6.

TABLE 6

Oxide frit ingredients for contact glasses in mole percent.

| | Glass Composition | | | |
|---|---|---|---|---|
| Ingredient | 6-1 | 6-2 | 6-3 | 6-4 |
| PbO | 1-90 | 10-70 | 20-50 | 20-40 |
| $V_2O_5$ | 1-90 | 10-70 | 25-65 | 45-65 |
| $P_2O_5$ | 5-80 | 5-80 | 5-40 | 5-25 |

In various embodiments of glass components disclosed herein, and in particular in Tables 1 to 6, apart from additions of $Al_2O_3$ or $B_2O_3$, additions of oxides of other trivalent elements such as $In_2O_3$, $Ga_2O_3$, $Tl_2O_3$, $Sc_2O_3$, $Y_2O_3$, $La_2O_3$, or of certain transition elements such as $Mn_2O_3$, $Cr_2O_3$, $Fe_2O_3$, or of rare earth elements such as $Ce_2O_3$, $Pr_2O_3$, $Nd_2O_3$, $Gd_2O_3$, $Tb_2O_3$, $Yb_2O_3$ in amounts of up to 20 mole % will be beneficial for enhancing the electrical performance of contacts to p-type emitters.

Metal Component.

In a solar cell contact, the metal is typically silver and/or aluminum. In the front contact if the invention, the metal component comprises both silver and aluminum. Silver particle sizes are important to provide a solar cell contact having desired properties. Two types of silver powders are used, each having a different particle size distribution and average. Accordingly, an embodiment of the invention is a paste formulation comprising (a) a first silver powder having a $D_{50}$ average particle size in microns of 0.2-1.7 microns, preferably 0.5-1.7 microns, and a second silver powder having a $D_{50}$ average particle size of 1.72-10.0 microns, preferably 1.75-5.0 micron. In one embodiment, the first and second $D_{50}$ values, which may be expressed as $D^1_{50}$ and $D^2_{50}$ may differ by at least 1%, preferably at least 2%, more preferably at least 3%, and successively more preferably by at least 4, 5, 6, 7, 8, 9, 10, 15, 20 and 25%, the percentage being calculated relative to $D^1_{50}$ (the smaller of the $D_{50}$ values).

The first (finer) and second (coarser) silver powders are present in a weight ratio of 1:10 to 100:0, preferably 1:8 to 8:1, more preferably 1:6-6:1, even more preferably 1.5:1-1:1.5. All values within all ranges are contemplated. The BET surface area of the first silver powder is 0.2-1.2 $m^2/g$, preferably 0.3-1 $m^2/g$, more preferably 0.4-0.9 $m^2/g$, for example 0.5-0.8 $m^2/g$. The BET surface area of the second silver powder is 0.05-0.5 $m^2/g$, preferably 0.1-0.4 $m^2/g$, more preferably 0.15-0.35 $m^2/g$, alternately 0.2-0.3 $m^2/g$ for example 0.2-0.3 $m^2/g$.

Various physical forms of metals may be used. For example, the solids portion of the paste may comprise about 80 to about 99 wt % spherical silver particles or alternatively about 75 to about 90 wt % silver particles and about 1 to about 10 wt % silver flakes. Alternatively the solids portion may comprise about 75 to about 90 wt % silver flakes and about 1 to about 10 wt % of colloidal silver, or about 60 to about 95 wt % of silver powder or silver flakes and about 0.1 to about 20 wt % of colloidal silver. Suitable commercial examples of silver particles are spherical silver powder Ag3000-1, silver flakes SF-29 and SF-75 and colloidal silver suspension RDAGCOLB, all commercially available from Ferro Corporation, Cleveland, Ohio.

An aluminum or aluminum alloy powder is also used in many embodiments of the invention. The paste applied to the silicon wafer may include 0.2-6 wt %, preferably 1-5 wt %, more preferably 1.5-3.5 wt %, for example 2-3 wt %. The aluminum particles have a $D_{50}$ average particle size 0.5-10 microns, preferably 2-9 microns, more preferably 2-8 microns, even more preferably 2-6 microns, still more preferably 1.0-4 microns, for example 1-3 microns.

Other Additives.

Up to about 30 wt % of other (i.e., inorganic) additives, preferably up to about 25 wt % and more preferably up to about 20 wt %, may be included as needed. Trivalent additives, i.e., dopants, such as B, Al, Ga, In, Tl, Sc, Y, La, Bi, transition elements such as Mn, Cr, Co, Rh, Ir, Os, Fe and rare earth elements such as Ce, Pr, Nd, Gd, Tb, Yb may be used in the form of metal or alloy or organo metallic or oxides or silicides or borides or nitrides. Other transition metals capable of exhibiting a trivalent (III) state can be used. Its also envisioned to add cobalt, copper, zinc, and/or iron either in a metallic or organometallic or oxide or other inorganic compounds such as pigments containing these elements to improve the electrical and adhesion properties.

Preferred dopants are a) trivalent dopants of silicon such as B, Al, Ga, In, Tl and (b) silicides or borides of trivalent transition elements such as Cr, Mn, Co, Fe, Rh, Ir, Os or rare earth elements such as Ce, Pr, Nd, Tb, Yb. Boron, Indium and Galium and/or compounds thereof, for example, InSe, In2Se3, GaSe, Ga2Se3 can be added to the paste in a variety of ways to reduce the resistance of the front contacts for p+ type emitters. In a preferred embodiment, such additives are used with the goal of eliminating aluminum from the contact. For example, certain glasses can be modified with boron-oxide in the form of a powdered or fritted oxide, or boron can be added to the paste by way of boride or other organoboron compounds. It can also be added as boron-silicide to the paste. Further, silicides of the other metals in this paragraph can be useful.

Other additives such as fine silicon or carbon powder, or both, and aluminum alloys such as Al-alloys such as Al—Si, for example 0.01 to 10 wt %, can be added to control the reactivity of the metal component with silicon. For example these fine silicon or carbon powder can be added to the front contact silver paste to control the silver reduction and precipitation reaction. The silver precipitation at the Ag/Si interface or in the bulk glass, for the silver pastes in both front contacts and rear contacts, can also be controlled by adjusting the firing atmosphere (e.g., firing in flowing $N_2$ or $N_2/H_2/H_2O$ mixtures). About 0.01 wt % to about 10 wt % of fine particles of low melting metal additives (i.e., elemental metallic additives as distinct from metal oxides) such as Pb, Bi, In, Ga, Sn, and Zn and alloys of each with at least one other metal can be added to provide a contact at a lower temperature, or to widen the firing window. Zinc is the preferred metal additive, and a zinc-silver alloy is most preferred for the front contact.

Aluminum is required in this fire-through paste for p-type emitter. Aluminum is used to form a low resistance contact with p-type emitter. However, Al by itself cannot be used since it will cause shunting at PN junction and degrades the cell efficiency. It also decreases the bulk resistivity of the paste which strongly degrades the series resistance of the cell in such grid pattern configuration.

It is preferred to have Al and other metals/alloys of at least 99% purity to maximize solar cell electrical performance. In place of pure Al, the aluminum may be provided by alloys such as Al—Si, Al—Ag and Al—Zn. The Al—Si eutectic (12.2 atomic % Si and 87.8 atomic % Al) may be used. Generally the Al—Si alloy with 0.01 to 30 atomic % Si may be used. Al—B alloys may be used, for example 68 atomic % B and 32 atomic % Al. Al—Ag alloys may be used alternately, having 0.01-50 atomic % Ag, preferably 0.01-20 atomic % Ag. Al—Zn alloys may be used. In particular, Al—Zn alloys having 16.5 atomic % Zn, or 59 atomic % Zn or 88.7 atomic % Zn are useful. More generally, Al—Zn alloys having 0.01-30 atomic % Zn or 40-70 atomic % Zn or 80-90 atomic % Zn are useful.

More than one paste can be used as a coating on the silicon wafer. Indeed, an embodiment of the invention is any solar cell herein having a second paste layer present at least partially coextensive with the paste on the p-side, the second paste having high conductivity or having low bulk resistivity, such as a bulk resistivity from $1\times10^{-6}$ to $4\times10^{-6}$ Ohm-cm.

All metals herein may be provided in one or more of several physical and chemical forms. Broadly, metal powders, flakes, salts, oxides, glasses, colloids, and organometallics are suitable. Generally, the metal powder sizes are about 0.1 to about 40 microns, preferably up to about 10 microns. More preferably, the metal particle sizes are in line with the sizes of aluminum and silver particles herein. Further, generally, any metals used herein may be provided in the form of ionic salts, such as the halides, carbonates, hydroxides, phosphates, nitrates, sulfates, and sulfites, of the metal of interest. Organometallic compounds of any of the metals may also be used, including, without limitation, the acetates, formates, carboxylates, phthalates, isophthalates, terephthalates, fumarates, salicylates, tartrates, gluconates, or chelates such as those with ethylenediamine (en) or ethylenediamine tetraacetic acid (EDTA). Other appropriate powders, salts, oxides, glasses, colloids, and organometallics containing at least one of the relevant metals will be readily apparent to those skilled in the art. Generally, silver, aluminum and other metals are provided as metal powders or flakes.

For example the paste may comprise about 80 to about 99 wt % spherical metal particles or alternatively about 35 to about 70 wt % metal particles and about 29 to about 55 wt % metal flakes. Alternatively the paste may comprise about 75 to about 90 wt % metal flakes and about 5 to about 9 wt % of colloidal metal, or about 60 to about 95 wt % of metal powder or flakes and about 4 to about 20 wt % of colloidal metal.

Organic Vehicle.

The pastes herein include a vehicle or carrier which is typically a solution of a resin dissolved in a solvent and, frequently, a solvent solution containing both resin and a thixotropic agent. The organics portion of the pastes comprises (a) at least about 80 wt % organic solvent; (b) up to about 15 wt % of a thermoplastic resin; (c) up to about 4 wt % of a thixotropic agent; and (d) up to about 2 wt % of a wetting agent. The use of more than one solvent, resin, thixotrope, and/or wetting agent is also envisioned. Although a variety of weight ratios of the solids portion to the organics portion are envisioned, one embodiment includes a weight ratio of the solids portion to the organics portion from about 20:1 to about 1:20, preferably about 15:1 to about 1:15, and more preferably about 10:1 to about 1:10.

Ethyl cellulose is a commonly used resin. However, resins such as ethyl hydroxyethyl cellulose, wood rosin, mixtures of ethyl cellulose and phenolic resins, polymethacrylates of lower alcohols and the monobutyl ether of ethylene glycol monoacetate can also be used. Solvents having boiling points (1 atm) from about 130° C. to about 350° C. are suitable. Widely used solvents include terpenes such as alpha- or beta-terpineol or higher boiling alcohols such as Dowanol® (diethylene glycol monoethyl ether), or mixtures thereof with other solvents such as butyl Carbitol® (diethylene glycol monobutyl ether); dibutyl Carbitol® (diethylene glycol dibutyl ether), butyl Carbitol® acetate (diethylene glycol monobutyl ether acetate), hexylene glycol, Texanol® (2,2,4-trimethyl-1,3-pentanediol monoisobutyrate), as well as other alcohol esters, kerosene, and dibutyl phthalate. The vehicle can contain organometallic compounds, for example those based on nickel, phosphorus or silver, to modify the contact. N-DIFFUSOL® is a stabilized liquid preparation containing an n-type diffusant with a diffusion coefficient similar to that of elemental phosphorus. Various combinations of these and other solvents can be formulated to obtain the desired viscosity and volatility requirements for each application. Other dispersants, surfactants and rheology modifiers, which are commonly used in thick film paste formulations, may be included. Commercial examples of such products include those sold under any of the following trademarks: Texanol® (Eastman Chemical Company, Kingsport, Tenn.); Dowanol® and Carbitol® (Dow Chemical Co., Midland, Mich.); Triton® (Union Carbide Division of Dow Chemical Co., Midland, Mich.), Thixatrol® (Elementis Company, Hightstown N.J.), and Diffusol® (Transene Co. Inc., Danvers, Mass.). Organic Vehicles 196, 215 and 618, as well as plasticizers sold under the Santicizer® trademark are available commercially from Ferro Corporation, Cleveland, Ohio.

Among commonly used organic thixotropic agents is hydrogenated castor oil and derivatives thereof. A thixotrope is not always necessary because the solvent coupled with the shear thinning inherent in any suspension may alone be suitable in this regard. Furthermore, wetting agents may be employed such as fatty acid esters, e.g., N-tallow-1,3-diaminopropane dioleate; N-tallow trimethylene diamine diacetate; N-coco trimethylene diamine, beta diamines; N-oleyl trimethylene diamine; N-tallow trimethylene diamine; N-tallow trimethylene diamine dioleate, and combinations thereof.

Method of Front and Back Contact Production.

Figure 1:
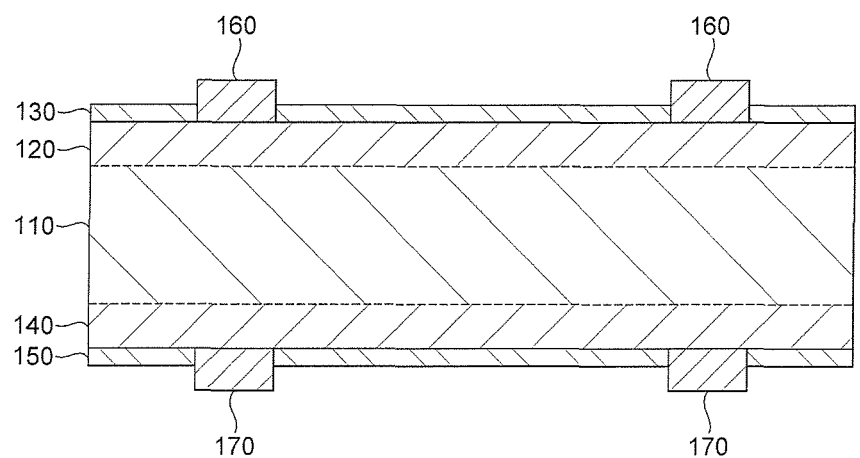
FIG. 1 schematically depicts a bifacial n-type solar cell with front p-type emitter.

Referring now to FIG. 1, a solar cell front contact according to the present invention generally can be produced by applying a silver-aluminum paste and a silver-based paste to a solar grade Si wafer. In particular, FIG. 1 shows a substrate of single-crystal silicon or multicrystalline silicon having a textured surface which reduces light reflection. In the case of solar cells, substrates are often used as sliced from ingots which have been formed from pulling or casting processes. Substrate surface damage caused by tools such as a wire saw used for slicing and contamination from the wafer slicing step are typically removed by etching away about 10 to 20 microns of the substrate surface using an aqueous alkali solution such as KOH or NaOH, or using a mixture of HF and $HNO_3$. The substrate optionally may be washed with a mixture of HCl and $H_2O_2$ to remove heavy metals such as iron that may adhere to the substrate surface. When the substrate used is a n-type substrate, a p-type layer 120 is formed to create a p-n junction. Boron may be used for this purpose. The depth of diffusion layer can be varied by controlling diffusion temperature and time, generally providing a sheet resistivity on the order of about 40 to about 100 ohms per square. An antireflective textured surface is sometimes formed thereafter using, for example, an aqueous alkali solution such as aqueous potassium hydroxide or aqueous sodium hydroxide. This gives the substrate, 110, depicted with exaggerated thickness dimensions, as a typical silicon wafer is 170-200 microns thick.

On the n-side of the wafer (back side), a phosphorus diffusion layer is supplied. The depth of diffusion layer can be varied by controlling diffusion temperature and time, generally producing a sheet resistivity on the order of about 40 to about 100 ohms per square.

Next, antireflective coatings (ARC) (also called passivating films or passivation coatings) 130 and 150, which may be $SiN_X$, $TiO_2$, $Al_2O_3$, $SiO_2$ or a combination of these, are formed on the above-described p-type diffusion layer, 120 (front side) and on the n-type diffusion layer 140. Silicon nitride film is sometimes expressed as $SiN_X$:H to emphasize passivation by hydrogen. The ARC 130 and 150 reduces the surface reflectance of the solar cell to incident light, increasing the electrical current generated. The thickness of ARC 130 and 150 depends on its refractive index, although a thickness of about 700 to 900 Å is suitable for a refractive index of about 1.9 to 2.0. The ARC may be formed by a variety of procedures including low-pressure CVD, plasma CVD, or thermal CVD. When thermal CVD is used to form a $SiN_X$ coating, the starting materials are often dichlorosilane ($SiCl_2H_2$) and ammonia ($NH_3$) gas, and film formation is carried out at a temperature of at least 700° C. When thermal CVD is used, pyrolysis of the starting gases at the high temperature results in the presence of substantially no hydrogen in the silicon nitride film, giving a substantially stoichiometric compositional ratio between the silicon and the nitrogen—$Si_3N_4$. Other methods of forming an ARC are known in the art.

On the front side, a silver-aluminum paste 160 is printed over the passivation layer 130. Similarly, on the back side, a silver paste 170 is printed over the passivation layer 150. The printed pastes may include one or more glass frits from any Table herein. Firing is then carried out in an infrared belt furnace at a temperature range of approximately 700° C. to 975° C. for a period of about a few seconds to several minutes, such as 1 or 5 seconds to 5 or 10 minutes.

During firing, the front electrode-forming silver-aluminum paste 160 sinters and penetrates through (i.e., fires through) the silicon nitride film 130, and is thereby able to electrically contact the p-type layer 120. The boundary between the front side silver-aluminum paste 160 and the silicon emitter layer 120 assumes an alloy state, which decreases the electrical barrier width to form the electrical contact. The backside silver paste 170 is fired at the same time as the front side, becoming a silver back contact.

The primary requirement of the inventive pastes is to achieve a very low contact resistance to p-type emitter on n-type base silicon solar cells. The inventive pastes must also fire-through the passivation layer to make contact to the p-type emitter. The inventive pastes maintain low bulk resistivity, with no shunting or junction leakage issues even though an aluminum component is present.

The low contact resistance and bulk resistivity play important roles in decreasing series resistance in a solar cell contacts made with the pastes of the invention, which help improve efficiency through increasing the fill factor.

The inventive pastes maintain a large value of Voc. It is also presented by achieving a low value of leakage saturation current density $J_{o2}$ in space-charge region. This is representative of a secured device junction.

Figure 2:
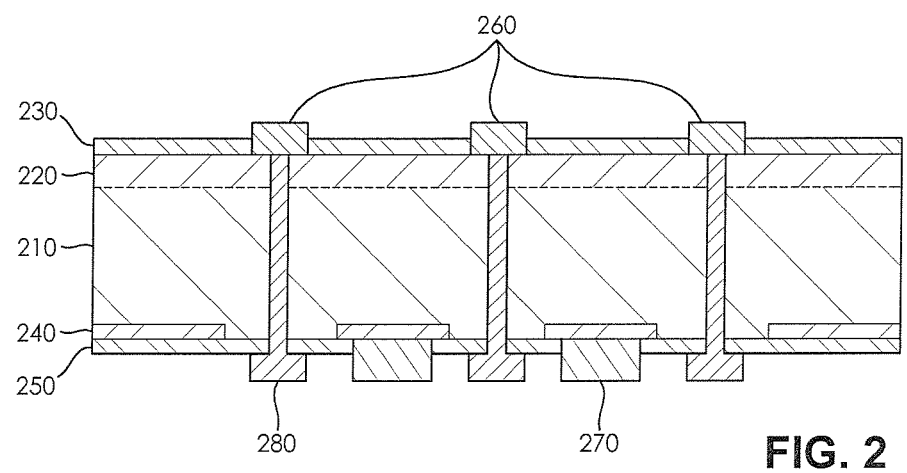
FIG. 2 schematically depicts a metal wrap through (MWT) solar cell.

Referring now to FIG. 2, a solar cell contact according to the present invention having the n-MWT configuration generally can be produced by applying a silver-aluminum plug paste and a silver-based paste to a solar grade Si wafer. In particular, FIG. 2 shows a substrate of single-crystal silicon or multicrystalline silicon (n-type Si) having a textured surface which reduces light reflection. When the substrate used is a n-type substrate, a p-type layer 220 is formed to create a p-n junction. Boron may be used for this purpose. The depth of diffusion layer can be varied by controlling diffusion temperature and time, generally providing a sheet resistivity on the order of about 40 to about 100 ohms per square. An antireflective textured surface is sometimes formed thereafter using, for example, an aqueous alkali solution such as aqueous potassium hydroxide or aqueous sodium hydroxide. This gives the substrate, 210, depicted with exaggerated thickness dimensions, as a typical silicon wafer is 170-200 microns thick. For a MWT cell, holes are formed in the silicon wafer substrate, typically by laser firing. The holes traverse the entire thickness of the n-type Si wafer.

On the n-side of the wafer (back side), a phosphorus diffusion layer is supplied. It can be a localized doping or needs to get isolated for example using laser, from the plug paste to prevent electrical short circuit. The depth of the diffusion layer can be varied by controlling diffusion temperature and time, generally producing a sheet resistivity on the order of about 40 to about 100 ohms per square.

Next, antireflective coatings (ARC) (also called passivating films or passivation coatings) 230 and 250, which may be $SiN_X$, $TiO_2$, $Al_2O_3$, $SiO_2$ or a combination of these, are formed on the above-described p-type diffusion layer, 220 (front side) and on the n-type diffusion layer 240. The ARC 230 and 250 reduces the surface reflectance of the solar cell to incident light, increasing the electrical current generated. The thickness of ARC 230 and 250 depends on its refractive index, although a thickness of about 700 to 900 Å is suitable for a refractive index of about 1.9 to 2.0. The ARC may be formed by a variety of procedures as noted elsewhere herein.

Plug paste 280 is applied into at least one hole that was previously formed in the n-type Si substrate. Suitable plug pastes include those having those disclosed in commonly owned U.S. Pat. App. Ser. No. 61/635,255, which is incorporated by reference. On the front side, a silver-aluminum paste 260 is printed over the passivation layer 230 where it also connects to the plug paste. Similarly, on the back side, a silver paste 270 is printed over the passivation layer 250.

Firing is then carried out in an infrared belt furnace at a temperature range of approximately 700° C. to 975° C. for a period of about a few seconds to several minutes, such as 1 or 5 seconds to 5 or 10 minutes.

During firing, the front electrode-forming silver-aluminum paste 260 sinters and penetrates through (i.e., fires through) the silicon nitride film 230, and is thereby able to electrically contact the p-type layer 220. The boundary between the front side silver-aluminum paste 260 and the silicon emitter layer 220 assumes an alloy state, which decreases the electrical barrier width to form the electrical contact. The backside silver paste 270 and plug paste 280 are fired at the same time as the front side. The silver paste 270 becomes a silver back contact. The plug paste becomes an electrical connection between front and back contacts for p-emitter.

Figure 3:
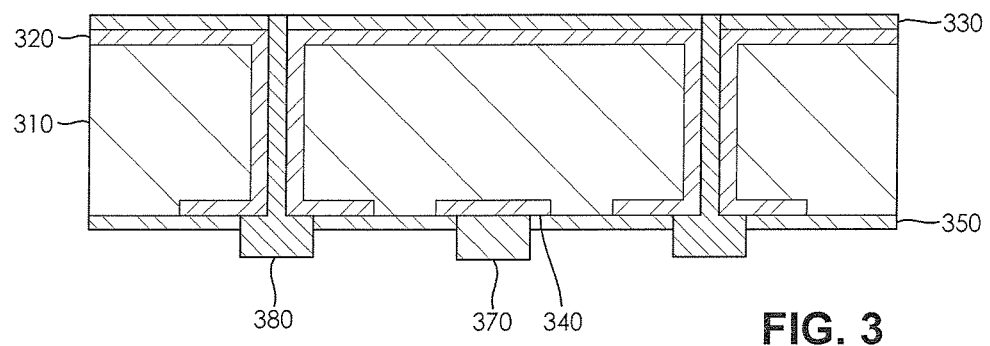
FIG. 3 schematically depicts an emitter wrap through (EWT) solar cell.

For an Emitter Wrap Through Solar Cell (EWT), referring now to FIG. 3, a solar cell contact according to the present invention having the EWT configuration generally can be produced by applying a silver-aluminum paste and a silver-based paste to a solar grade Si wafer. In particular, FIG. 3 shows a substrate of single-crystal silicon or multicrystalline silicon (n-type Si) having a textured surface which reduces light reflection. When the substrate used is a p-type substrate, a n-type layer 320 is formed to create a p-n junction. Boron may be used for this purpose. An antireflective textured surface is sometimes formed thereafter using, for example, an aqueous alkali solution such as aqueous potassium hydroxide or aqueous sodium hydroxide. This gives the substrate, 310, depicted with exaggerated thickness dimensions, as a typical silicon wafer is −170-200 microns thick. For an EWT cell, holes are formed in the silicon wafer substrate, typically by laser firing. The holes traverse the entire thickness of the Si wafer.

On the back side of the wafer there are n-type wrap through islands as well as interdigitated p-islands. Next, antireflective coatings (ARC) (also called passivating films or passivation coatings) 330 and 350, which may be $SiN_X$, $TiO_2$, $Al_2O_3$, $SiO_2$ or a combination of these, are formed on the n-type diffusion layer, 320 (front side) and on the back side including diffusion layer 340. The ARC 330 and 350 reduces the surface reflectance of the solar cell to incident light, increasing the electrical current generated. The thickness of ARC 330 and 350 depends on its refractive index, although a thickness of about 700 to 900 Å is suitable for a refractive index of about 1.9 to 2.0. The ARC may be formed by a variety of procedures as noted elsewhere herein.

On the back side, a silver/aluminum paste 370 is printed over a p-island 340 which is beneath the passivation layer 350. Suitable silver/aluminum pastes include any paste disclosed herein. Silver plug paste 380 is applied into at least one hole that was previously formed in the Si substrate. Suitable plug pastes include any paste disclosed elsewhere herein. The plug paste also contacts n-islands on the back such as Ferro product NS3127 commercially available from Ferro Corporation, Cleveland, Ohio.

Firing is then carried out in an infrared belt furnace at a temperature range of approximately 700° C. to 975° C. for a period of about a few seconds to several minutes, such as 1 or 5 seconds to 5 or 10 minutes.

During firing, the rear electrode-forming silver-aluminum plug paste 380 is able to electrically contact the p-type layer 320. The backside silver paste 370 and plug paste 380 are fired at the same time as the front side. The silver paste 370 becomes a silver back contact. The plug paste 380 becomes electrical contact for p-type wrap through emitter.

The paste rheology; elastic (G') and viscous (G") modulus, is engineered ensure the paste is compatible with narrow line width screen print design with line openings of less than 100 microns. The key constituents which result in low contact resistance (Re) are aluminum powder with certain range of particle size, two types of Ag powders with different particle sizes, and two glasses with different chemistries and softening points.

Paste Preparation.

The paste according to the present invention may be conveniently prepared on a three-roll mill. The amount and type of carrier utilized are determined mainly by the final desired formulation viscosity, fineness of grind of the paste, and the desired wet print thickness. In preparing compositions according to the present invention, the particulate inorganic solids are mixed with the vehicle and dispersed with suitable equipment, such as a three-roll mill, to form a suspension, resulting in a composition for which the viscosity will be in the range of about 100 to about 500 kcps, preferably about 300 to about 400 kcps, at a shear rate of 9.6 $sec^{-1}$ as determined on a Brookfield viscometer HBT, spindle 14, measured at 25° C.

Printing and Firing of the Pastes.

The aforementioned paste compositions may be used in a process to make a solar cell front silver-aluminum contact as well as back silver contact both in dried pattern shape. The aforementioned pastes can be used in both single and double printing configurations on a passivated boron emitter surface, in particular applicable to n-type wafer and n-MWT cells. In a double printing configuration, in first layer a low contact resistance paste is utilized (same pastes under this patent) which fires-through the passivation layer and forms contact with silicon. For the second layer a highly conductive paste is used which does not have a fire-through composition and the main feature is low paste bulk resistivity. This combination has potential to reduce series resistance (Rs) of the solar cell.

The second layer can also contain pure metals, additives in the form of mixtures of metals and/or their oxides or silicides or carbides or nitrides or alloys, including, for example that of Zn, Pb, Sn, Bi, Sb, Mn, Cr, Cu, Rh, Ru, Pt, Au, Co, V, Cr, Ti, Ni. The additives are designed so that the glass in the first layer flows minimally to the second layer upon firing.

The inventive method of making front and back contacts for an p-emitter type in n-type silicon solar cell comprises: (1) applying a silver-aluminum containing paste to the front side of silicon substrate with p-type emitter, (2) drying the paste, (3) applying a silver containing paste to the back side of silicon substrate with n+ base; (4) drying the second paste, (5) co-firing the pastes to sinter the metal, fire through the passivation layers at both sides and make contact to silicon on both sides concurrently. The printed pattern of the pastes is fired at a suitable temperature, such as about 650-1100° C. furnace set temperature, or about 550-850° C. wafer temperature. Preferably, the furnace set temperature is about 750-930° C., and the paste is fired in air. During the firing the antireflective $SiN_X$ layer is believed to be oxidized and corroded by the glass and Ag/Si islands are formed on reaction with the Si substrate, which are epitaxially bonded to silicon. Firing conditions are chosen to produce a sufficient density of Ag/Si islands containing Al on the silicon wafer at the silicon/paste interface, leading to a low resistivity, high efficiency, high-fill factor front contact and solar cell.

A typical ARC is made of a silicon compound such as silicon nitride, generically SiNx, such as $Si_3N_4$, and possibly $Al_2O_3$ or $TiO_2$. This ARC layer acts as an insulator, which tends to increase the contact resistance. Corrosion of this ARC layer by the glass component is hence a necessary step in both front and back contact formation. Reducing the resistance between the silicon wafer and the paste improves solar cell efficiency and is facilitated by the formation of metal-silicon conductive islands. That is, the silver-aluminum islands on silicon assume the same crystalline structure as is found in the silicon substrate. Both the interactions among paste constituents (silver and aluminum metals, glass, additives, organics), and the interactions between paste constituents and silicon substrate are complex, yet must be controlled. The rapid furnace processing makes all the reactions highly dependent on kinetics. Further, the reactions of interest must take place within a very narrow region (<0.5 micron) of silicon in order to preserve the p-n junction Method of Front Contact Production.

A solar cell front contact according to the present invention can be produced by applying any Ag/Al paste produced by mixing silver and aluminum powders with glasses disclosed herein to the p-side of the silicon substrate, for example by screen printing, to a desired wet thickness.

Method of Silver Rear Contact Production.

A solar cell silver rear contact according to the present invention can be produced by applying any Ag paste produced by mixing silver powders with leaded or lead free glasses disclosed herein to the n-side of the silicon substrate, for example by screen printing, to a desired wet thickness.

For both front and back grid pattern, identical printing circumstances may apply. Automatic screen printing techniques can be employed using a 200-325 mesh screen. The printed pattern is then dried at 200° C. or less, preferably at about 120° C. for about 5-15 minutes before firing. The dry printed pattern can be co-fired with silver rear grid contact pastes for as little as 1 second up to about 5 minutes at peak temperature, in a belt conveyor furnace in air.

Nitrogen ($N_2$) or another inert atmosphere may be used if desired, but it is not necessary. The firing is generally according to a temperature profile that will allow burnout of the organic matter at about 300° C. to about 550° C., a period of peak furnace set temperature of about 650° C. to about 1000° C., lasting as little as about 1 second, although longer firing times as high as 1, 3, or 5 minutes are possible when firing at lower temperatures. For example a three-zone firing profile may be used, with a belt speed of about 1 to about 4 meters (40-160 inches) per minute. Naturally, firing arrangements having more than 3 zones are envisioned by the present invention, including 4, 5, 6, or 7, zones or more, each with zone lengths of about 5 to about 20 inches and firing temperatures of 650 to 1000° C.

Examples. For the contact resistance measurement, the paste samples were screen printed as a TLM pattern (Transmission Line Model) on passivated Boron-doped surface, as disclosed in G. K. Reeves and H. B. Harrison, IEEE electron device Letters, Vol. EDL-3, No. 5 (1982), which is incorporated by reference herein. The wafers were then fired in a six-zone dispatch furnace. Resultant contact resistance values (Re) are reported in FIG. 2, while bulk resistivity is reported in FIG. 3. The values show about a 60% reduction in contact resistance compared to starting reference paste.

R-line, which is average resistance of each gridline, indicates the front printing quality as the average line cross section profile, and is also affected by the bulk resistivity of the paste which is characteristic to the material used. These values are reported in Table 6 and are in comparable range of values for front Ag pastes for conventional p-type Si solar cells with n-emitter. While in prior art formulations the Al sometimes degrades the noted parameters, the inventive formulations escape this detrimental effect.

In Table 6, certain constituents are defined as follows: Vehicle 196 is 80% Dowanol® and 20% Ethyl cellulose; Vehicle 215 is 90.9% Dowanol®, 9.1 Thixatrol® ST; Vehicle 618 is 68.8% Dowanol®, 11.2% Ethyl cellulose, 20% Thixatrol® ST; Vehicle 473 is 83.85% Dowanol®, 2.15% Alpha-terpineol, 14% Ethyl cellulose. Santicizer® 9100 is dipropylene glycol dibenzoate and Santicizer® 2148, Plasticizer is an alkyl aryl phosphate ester plasticizer with low volatility. SF 75 Silver flake has a BET surface area of about 1.2 $m^2/g$. The foregoing are commercially available from Ferro Corporation, Cleveland Ohio. EG 9014 and GQ Mod1 are commercially available glass powders from Ferro Corporation. EG 9014 has a formulation falling in the ranges of composition 2-3 in table 2, a softening point of 395° C., a density of 6.28 g/cc and a CTE of $96 \times 10^{-7}/°$ C. GQ Mod 1 has a formulation falling within composition 2-6 of Table 2, a softening point of 352° C., a density of 6.36 g/cc and a CTE of $103 \times 10^{-7}/°$ C.

TABLE 6

Paste formulations and performance testing.

| Material | Ref (prior art) | I (invention) | II (invention) | III (invention) |
|---|---|---|---|---|
| Dowanol DB | 2.00 | 4.86 | 4.86 | 4.86 |
| Vehicle 196 | | 3.16 | 3.16 | 3.16 |
| Vehicle 215 | | 0.47 | 0.47 | 0.47 |
| Vehicle 618 | | 0.71 | 0.71 | 0.71 |

TABLE 6-continued

Paste formulations and performance testing.

| Material | Ref (prior art) | I (invention) | II (invention) | III (invention) |
|---|---|---|---|---|
| Vehicle 473 | 4.09 | | | |
| Santicizer 9100 | 6.28 | 3.56 | 3.56 | 3.56 |
| Santicizer 2148 | 0.63 | 0.24 | 0.24 | 0.24 |
| EG9014 glass powder | | 2.00 | 2.00 | 5.40 |
| GQMod1 glass powder | 5.00 | 3.00 | 3.00 | 0.00 |
| 2 micron Ag Powder | | 32.00 | 32.00 | 31.60 |
| 1 micron Ag Powder | | 47.00 | 48.00 | 47.00 |
| SF75 Ag flake | 79.00 | | | |
| 5 micron Al powder | 3.00 | 3.00 | 2.00 | 3.00 |
| Contact Resistance (mOhm-cm$^2$) | 3.0 | 1.2 | 2.5 | 2.3 |
| R-line (Ohm/cm) | 0.30 | 0.29 | 0.22 | 0.27 |
| Bulk Resistivity (Ohm-cm) | 7.00E−6 | 6.27E−6 | 5.39E−6 | 6.14E−6 |

The term "comprising" provides support for "consisting essentially of" and "consisting of." It is envisioned that an individual numerical value for a parameter, temperature, weight, percentage, etc., disclosed herein in any form, such as presented in a table, provides support for the use of such value as the endpoint of a range. A range may be bounded by two such values. In a single embodiment, more than one glass composition can be used, and compositions comprising amounts and ranges from different columns among the tables are also envisioned.

Certain embodiments of the invention are envisioned where at least some percentages, temperatures, times, and ranges of other values are preceded by the modifier "about." All compositional percentages are by weight and are given for a blend prior to firing. Numerical ranges of oxides or other ingredients that are bounded by zero on the lower end (for example, 0-10 mole % ZnO) are intended to provide support for the concept "up to [the upper limit]," for example "up to 10 mole % ZrO$_2$" as well as a positive recitation that the ingredient in question is present in an amount that does not exceed the upper limit.

Each numerical range disclosed herein that is bounded by zero, has, as an alternative embodiment, a lower bound of 0.1% instead of zero. All ranges disclosed herein are to be understood to encompass the beginning and ending range values and any and all subranges therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1.0 to 2.7, 3.3 to 8.9, 5.7 to 10, or individual values like 4.17, 7.53 or 8.06 for example. In other words, ranges are used as shorthand for describing each and every value that is within the range. Any value within the range can be selected as a terminus of a subrange within the range.

The invention claimed is:

1. A solar cell comprising at least one passivation coating and a contact through the at least one passivation coating, wherein the contact comprises a paste comprising, prior to firing,
   a. about 40-60 wt % of a first silver powder having a D$_{50}$ particle size in a range of 0.5-1.7 microns, and about 25-45 wt % of a second silver powder having a D$_{50}$ particle size in a range of 1.75-5 microns,
   b. about 1-5 wt % of a first glass frit having a first softening temperature in the range of 300-450° C., and a D$_{50}$ particle size range of 0.2 to 20 microns,
   c. about 1-5 wt % of a second glass frit having a second softening temperature in the range of 350-575° C., and a D$_{50}$ particle size range of 0.2 to 20 microns, and
   d. about 0.2-6 wt % elemental aluminum,
   wherein the first and second softening temperatures differ by at least 10° C., and wherein the paste fires through the passivation coating of the solar cell during firing.

2. The solar cell of claim 1, wherein the D$_{50}$ particle size of the first silver powder differs from the D$_{50}$ particle size of the second silver powder by more than 2.5%.

3. The solar cell of claim 1, wherein the paste further comprises 0.01 to 6 wt % of a dopant having the form of a metal, an alloy, an organometallic compound, a silicide, a boride, a nitride an oxide and combinations thereof, wherein the dopant includes at least one trivalent element.

4. The solar cell of claim 3, where the dopant is a metal or alloy of B, In, Ga, Tl, and combinations thereof.

5. The solar cell of claim 3, wherein the dopant is an oxide of an element selected from the group consisting of Cr, Mn, Fe, Co, Ni, Ru, Rh, Ir, Os, Sc, Y, La, and combinations thereof.

6. The solar cell of claim 1, wherein the paste further comprises, prior to firing, 0.01 to 10 wt % of silicon.

7. The solar cell of claim 1, wherein the paste further comprises, prior to firing, at least one silicide of a metal selected from trivalent transition elements or trivalent rare earth elements.

8. The solar cell of claim 1, wherein the paste further comprises, prior to firing, at least one boride of a metal selected from trivalent transition elements or trivalent rare earth elements.

9. A solar cell comprising:
   a. an n-type silicon wafer,
   b. a p-type emitter,
   c. a passivation coating,
   d. a contact through the passivation coating, comprising a paste, the paste comprising, prior to firing,
      i. about 40-60 wt % of a first silver powder, having a first average particle size D$^1{}_{50}$ in a range of 0.5-1.7 microns,
      ii. about 25-45 wt % of a second silver powder, having a second average particle size D$^2{}_{50}$ in a range of 1.75-5 microns, such that D$^1{}_{50}$ differs from D$^2{}_{50}$ by more than 2.5%,
      iii. about 1-5 wt % of a first glass frit having a softening temperature in the range of 300-450° C., and a D$_{50}$ particle size range of 0.2 to 20 microns,
      iv. about 1-5 wt % of a second glass frit having a softening temperature in the range of 350-575° C., and a D$_{50}$ particle size range of 0.2 to 20 microns, and
      v. about 0.2-6 wt % elemental aluminum,
   wherein the first and second softening temperatures differ by at least 10° C., and wherein the paste fires through the passivation coating of the solar cell during firing.

10. The solar cell of claim 9, wherein the paste further comprises, prior to firing, 0.01 to 10 wt % of silicon.

11. The solar cell of claim 9, wherein a second paste layer is present at least partially coextensive with the paste on the p-type emitter, the second paste layer having a bulk resistivity from $1 \times 10^{-6}$ to $4 \times 10^{-6}$ Ohm-cm after firing.

12. A solar cell comprising a passivation coating and a contact through the passivation coating, wherein the contact comprises a paste comprising, prior to firing, a. about 40-60 wt % of a first spherical silver powder having a $D_{50}$ particle size in a range of 0.5-1.7 microns,
b. about 25-45 wt % of a second spherical silver powder having a $D_{50}$ particle size in a range of 1.75-5 microns,
c. about 1-5 wt % of a first glass frit having a first softening temperature in the range of 300-450° C., and a $D_{50}$ particle size range of 0.2-20 microns,
d. about 1-5 wt % of a second glass frit having a second softening temperature in the range of 350-575° C., and a $D_{50}$ particle size range of 0.2-20 microns, and
e. about 0.2-6 wt % elemental aluminum,
wherein the first and second softening temperatures differ by at least 10° C., and wherein the paste fires through the passivation coating of the solar cell during firing.

* * * * *